United States Patent
McKenney et al.

(10) Patent No.: US 6,645,549 B1
(45) Date of Patent: Nov. 11, 2003

(54) PROCESS FOR PROVIDING BOND ENHANCEMENT AND AN ETCH RESIST IN THE FABRICATION OF PRINTED CIRCUIT BOARDS

(75) Inventors: Darryl J. McKenney, Londonderry, NH (US); Arthur J. Demaso, Nashua, NH (US); Kathy A. Gosselin, Atkinson, NH (US); Craig S. Wilson, Brookline, NH (US)

(73) Assignee: Parlex Corporation, Methuen, MA (US)

( * ) Notice: Subject to any disclaimer, the term of this patent is extended or adjusted under 35 U.S.C. 154(b) by 0 days.

(21) Appl. No.: 09/958,647
(22) PCT Filed: Apr. 24, 2000
(86) PCT No.: PCT/US00/10939
§ 371 (c)(1), (2), (4) Date: Oct. 11, 2001

Related U.S. Application Data
(60) Provisional application No. 60/130,720, filed on Apr. 22, 1999.

(51) Int. Cl.$^7$ .................... C25D 3/60; C23C 18/54; C23C 28/02; B05D 5/10; B05D 5/12
(52) U.S. Cl. .................... 427/98; 427/435; 427/409; 427/410; 427/386; 205/87; 205/252; 205/191; 205/300
(58) Field of Search .................... 428/626, 450, 428/624, 646, 647, 674, 457, 416, 418, 935, 936, 447; 427/98, 96, 437, 435, 436, 407.1, 409, 410, 404, 405, 344, 386; 106/1.25; 205/85, 87, 191, 220, 252, 300; 174/259, 256

(56) References Cited

U.S. PATENT DOCUMENTS

| | | | | |
|---|---|---|---|---|
| 4,269,625 A | * | 5/1981 | Molenaar | 106/1.22 |
| 4,882,202 A | | 11/1989 | Holtzman et al. | 427/98 |
| 5,073,456 A | | 12/1991 | Palladino | 428/446 |
| 5,169,692 A | | 12/1992 | Couble et al. | 427/436 |
| 5,196,053 A | | 3/1993 | Dodd et al. | 106/1.22 |
| 5,211,831 A | | 5/1993 | Vitale et al. | 205/85 |
| 5,217,751 A | | 6/1993 | King et al. | 427/98 |
| 5,452,842 A | * | 9/1995 | Melton et al. | 228/180.22 |
| 6,361,823 B1 | * | 3/2002 | Bokisa et al. | 427/98 |

* cited by examiner

Primary Examiner—Michael LaVilla
(74) Attorney, Agent, or Firm—Weingarten, Schurgin, Gagnebin & Lebovici LLP

(57) ABSTRACT

A process for providing bond enhancement and an etch resist for a printed circuit board is provided. A sheet comprising at least a layer of copper is immerses in a first immersion tin solution comprising a tin metal and a complexing agent in an acidic medium for a time sufficient to deposit a first heavy tin deposit on the sheet. The sheet is then immersed in a second immersion tin solution comprising stannous tin ions and stannic tin ions and a complexing agent in an acidic medium for a time sufficient to deposit a second thin tin deposit on the sheet. The second thin tin deposit has a thickness less than a thickness of the first heavy tin deposit. A rough surface texture providing mechanical adhesion sites results. The board is then treated with a coupling agent, such as silane, for enhanced bonding to a subsequent epoxy or other polymer prepreg. Additionally, the first heavy tin deposit may serve as an etch resist in subsequent fabrication of the provided circuit board.

21 Claims, 2 Drawing Sheets

PROCESS FOR PROVIDING BOND ENHANCEMENT AND AN ETCH RESIST IN THE FABRICATION OF PRINTED CIRCUIT BOARDS

CROSS REFERENCE TO RELATED APPLICATIONS

Applicants claim priority under 35 U.S.C. §119(e) to U.S. Provisional Application No. 60/130,720 filed Apr. 22, 1999, the disclosure of which is incorporated by reference herein.

STATEMENT REGARDING FEDERALLY SPONSORED RESEARCH OR DEVELOPMENT

N/A

BACKGROUND OF THE INVENTION

In the fabrication of printed circuit boards, a thin coating of tin, typically 0.1 microns in thickness, is applied to a copper or copper alloy substrate. A silane coupling agent is applied over the tin coating. This process is primarily used as a bonding enhancement to improve the subsequent adhesion of an epoxy prepreg to the metal of a multilayer printed circuit board. This tin coating produces only marginal improvement as a bonding intermediate for the adhesion of copper to no-flow and low-flow epoxy prepregs. Also, the tin coating is typically too thin and porous to be used as an etch resist for the manufacture of printed circuit boards.

Examples of tin coating processes for circuit boards may be found in U.S. Pat. Nos. 5,073,456, 5,196,053, 5,211,831, and 5,217,751.

SUMMARY OF THE INVENTION

The present invention provides the use of multiple tin coatings that have superior chemical resistance and enhance adhesion in fabricating printed circuit boards. A first coating of tin provides a white tin layer that serves as an etch resist at the primary or secondary etching operation during the fabrication of the printed circuit traces. A second coating of tin provides a layer that serves as a bonding agent or bonding enhancement layer that allows the lamination of no-flow and low-flow prepreg materials to a copper surface with resulting adhesion between the polymer and the metal exceeding four pounds per inch.

DESCRIPTION OF THE DRAWINGS

The invention will be more fully understood from the following detailed description taken in conjunction with the accompanying drawings in which.

DETAILED DESCRIPTION OF THE INVENTION

Figure 1:
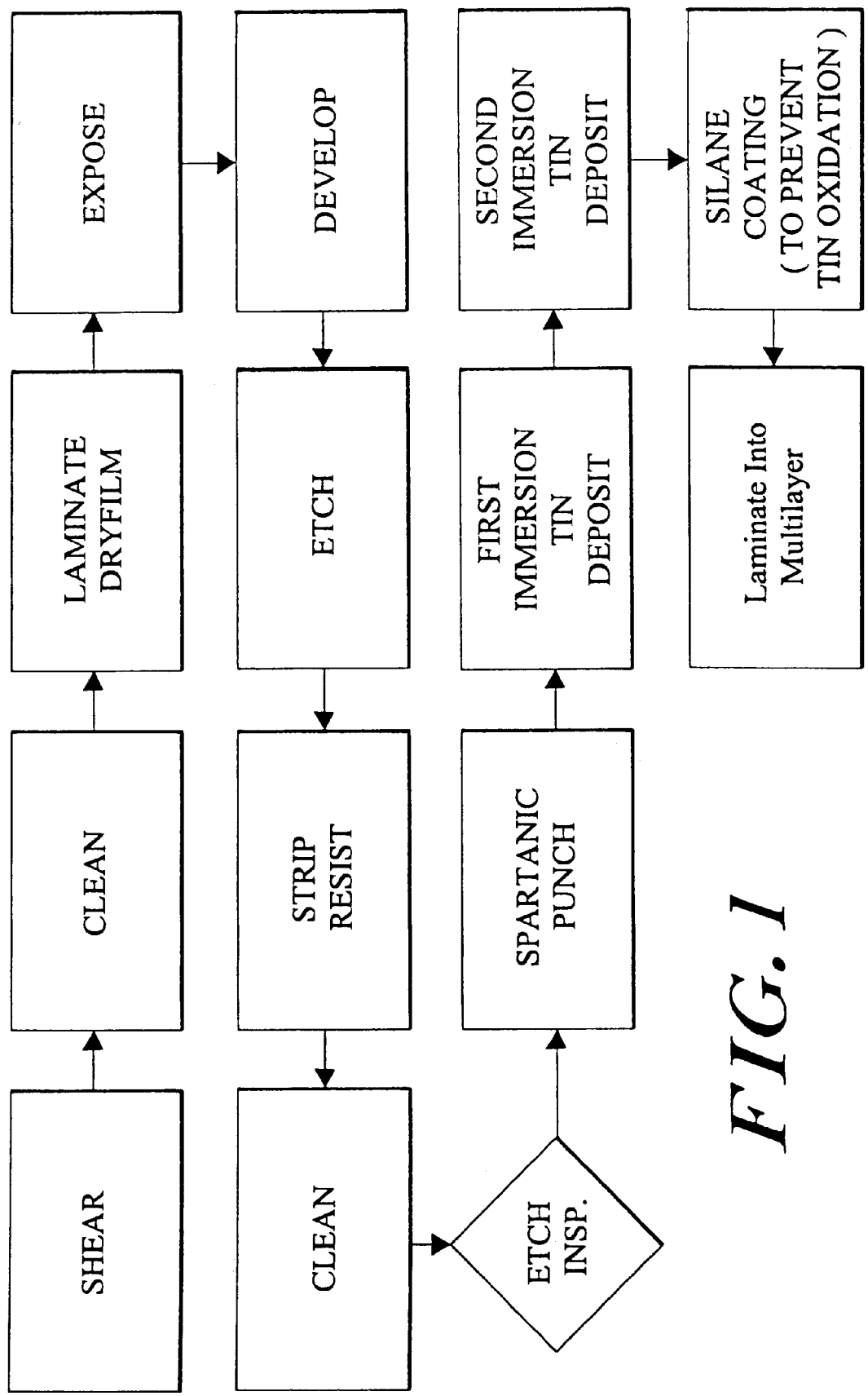
FIG. 1 is a flow chart of steps in the process of the present invention.

The process begins with a sheet or film of copper, typically ranging from 0.5 mils to 3.0 mils in thickness. The sheet may also be a lamination of a dielectric of, for example, an epoxy material or KAPTON® sandwiched between two layers of copper. Referring to FIG. 1, the sheet is sheared and cleaned to prepare for the etching of a circuit pattern thereon. Then a dry film is laminated to the sheet, and the sheet is exposed, developed, and etched to produce the circuit pattern in the copper. The etch resist is stripped, and the sheet is cleaned and inspected. Any necessary holes are punched in the sheet.

At this point, the sheet is immersed in an immersion tin solution, preferably by a conveyorized liquid flood regime. The sheet could alternatively be dipped in a bath or reservoir of the immersion tin solution. Other coating techniques could be used, as would be known in the art. The immersion tin solution suitably comprises 10 to 30 g/l of total tin metal (stannous and/or stannic ions) and a complexing agent, such as thiourea in a concentration of 20 to 80 g/l, in an acid medium, such as 20 to 80 g/l of methane sulfonic acid. In the presence of the acid medium, the copper is displaced by tin ions. The displaced copper is complexed with the complexing agent for subsequent removal, as by filtering, from the process. Other compounds, such as various reducing agents, are typically included in the immersion tin solution, as would be known in the art. Preferably, the solution is stored in a tank or reservoir at a temperature range of 120 to 175° F. and is circulated through the process to the sheet. The tank may be replenished with the tin metal, the completing agent, or other compounds as needed.

The sheet is immersed in the tin for a time sufficient to deposit a layer of tin that is able to serve as an etch resist in subsequent processing. Typically, 1 minute is a sufficient time. The thickness of the first tin layer may range from 0.1 microns to 1.5 microns. This tin layer is referred to as a heavy tin or high build immersion tin layer.

The sheet is conveyed from the first immersion tin solution and rinsed with water. Typically, deionized water is used in this rinse step.

Next, the sheet is immersed in a second immersion tin solution. The composition of the second immersion tin solution suitably comprises 6 to 15 g/l of a stannous ion, 10 to 25 g/l of total tin metal, 40 to 80 g/l of a complexing agent such as thiourea, and 0 to 3.0 g/l of copper. The acid medium may be, for example, 8 to 12% by weight of sulfuric acid. The temperature may range from 80 to 120° F. in the second immersion step, a thin tin or low build immersion tin layer is deposited over the first heavy tin layer. In this step, there appears to be a selective chemical mechanism that modifies the initial heavy tin deposit through dissolution of discrete areas, creating cavities and pinholes in the heavy tin deposit. The resulting surface has a rough texture with multiple craters or pores. This rough surface provides a greater surface area, which provides more binding sites for the epoxies and organic polymers of subsequent processing steps.

The sheet is held in the second immersion tin solution for a time sufficient to create a sufficiently rough texture, but not so long that the underlying heavy tin deposit is etched through to the copper layer beneath. The heavy tin deposit must remain sufficiently thick to serve as an etch resist in subsequent processing. A time of 30 seconds has been found to be sufficient for the second immersion tin step. The thickness of the resulting second tin coating at selected sites is thin, approximately 0.05 microns to 0.1 microns.

After removal of the sheet from the second immersion tin solution, a coupling agent, such as a silane coating, is applied to prevent oxidation of the tin and serve as a coupling agent to enhance bonding to the subsequent epoxy or other organic polymer layers, as is known in the art. The sheet then proceeds on to further processing as known in the art.

Figure 2:
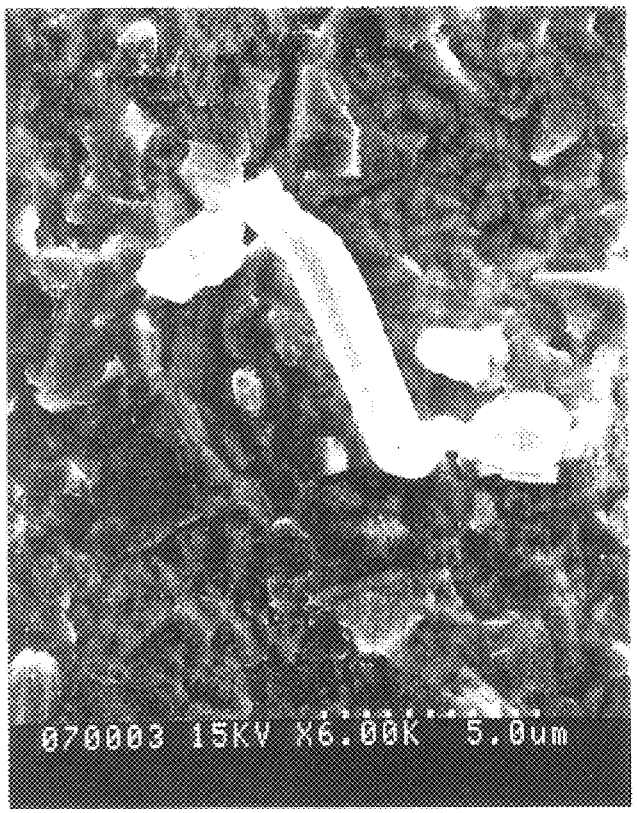
FIG. 2 is a scanning electron image of a circuit board after application of a first immersion tin coating (heavy tin)
Figure 3:
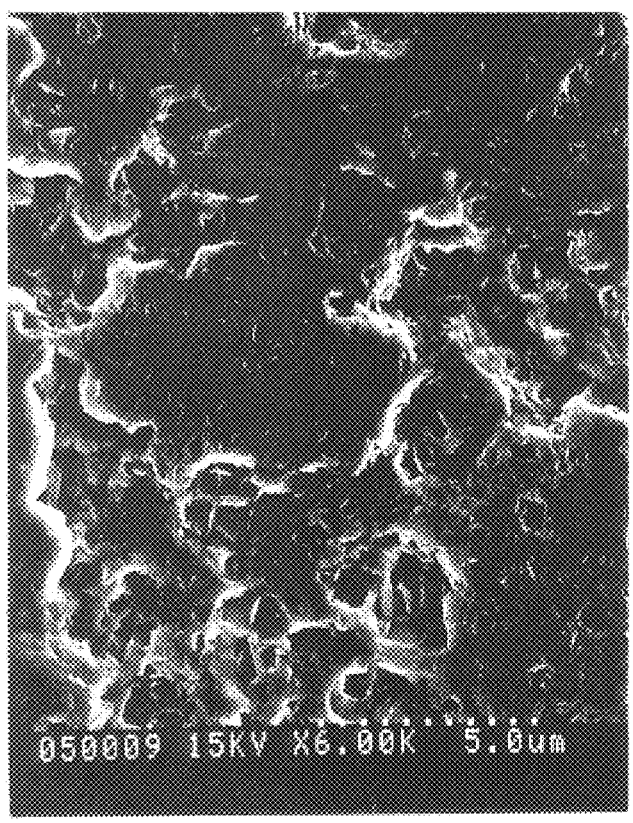
FIG. 3 is a scanning electron image of a circuit board after application of a second immersion tin coating (thin tin).

FIG. 2 is a scanning electron image of a copper sheet that has been immersed in a first high build immersion tin solution as described above. FIG. 3 is a scanning electron image of a copper sheet that has been immersed in a second low build immersion tin solution as described above. FIG. 3 shows the rough surface with greater surface area that results after the second immersion tin solution and the selective dissolution of discrete areas of the heavy tin deposit. The resulting cavities and pinholes provide mechanical adhesion sites into which polymer resins flow and anchor during the subsequent lamination step in the construction of multilayer printed circuit boards. These mechanical adhesion sites in conjunction with a silane treatment with epoxy prepregs have been shown to provide an improvement of two to four times in the adhesion of the polymer to the copper/tin/tin/silane inner layer over the prior art process of a single tin layer and silane treatment.

As noted above, the heavy tin deposit of the present invention is useful as an etch resist. For example, in flexible printed circuit boards having bend areas, it is known to protect the copper circuitry in the exposed bend area with a polyimide or epoxy layer intrinsic with the design of the board. This requires additional inner layer components, which in turn create thicker and more costly multilayer constructions. According to the present invention, the outer layer copper in the bend area may be protected from etching by the dual heavy tin and thin tin layers as discussed above.

The invention is not to be limited by what has been particularly shown and described, except as indicated by the appended claims.

We claim:

1. A process for fabricating a printed circuit board, comprising;
   providing a sheet comprising at least a layer of copper;
   firstly immersing the sheet in a first immersion tin solution, the first immersion tin solution comprising a metal, the metal consisting essentially of a tin metal, and a complexing agent in an acidic medium, for a time sufficient to deposit a first tin deposit on the sheet; and
   secondly immersing the sheet in a second immersion tin solution, the second immersion tin solution comprising stannous tin ions and stannic tin ions and a complexing agent in an acidic medium, for a time sufficient to deposit a second tin deposit on the first tin deposit on the sheet, the second tin deposit having a thickness less than a thickness of the first tin deposit.

2. The process of claim 1, wherein the sheet is immersed in the first immersion tin solution for a time sufficient to provide a heavy tin deposit ranging from 0.1 to 1.5 microns.

3. The process of claim 1, wherein the sheet is immersed in the first immersion tin solution for a time sufficient to provide a heavy tin deposit that is operative as an etch resist.

4. The process of claim 1, wherein the sheet is immersed in the second immersion tin solution for a time sufficient to provide a thin tin deposit ranging from 0.05 to 0.1 microns.

5. The process of claim 1, further comprising rinsing the sheet after immersing the sheet in the first immersion tin solution and before immersing the sheet in the second immersion tin solution.

6. The process of claim 5, wherein the sheet is rinsed in deionized water.

7. The process of claim 1, further comprising treating a side of the sheet having the first tin deposit and the second deposit with a coupling agent after immersing the sheet in the second immersion tin solution.

8. The process of claim 7, wherein the coupling agent comprises a silane coating.

9. The process of claim 1, further comprising bonding an epoxy layer to a side of the sheet having the first tin deposit and the second tin deposit.

10. The process of claim 1, wherein further comprising etching the sheet to provide printed circuit traces.

11. The process of claim 1, wherein the second immersion tin comprises 6 to 15 g/l of stannous tin ions and 10 to 25 g/l of total tin metal.

12. The process of claim 1, wherein the complexing agent in both the first immersion tin solution and the second immersion tin solution comprises thiourea.

13. The process of claim 1, wherein the acidic medium of the first immersion tin solution comprises methane sulfonic acid.

14. The process of claim 1, wherein the first immersion tin solution is applied by flooding the sheet in a conveyorized liquid flood regime or by dipping the sheet in a bath of the first immersion tin solution.

15. The process of claim 1, wherein the second immersion tin solution is applied by flooding the sheet in a conveyorized liquid flood regime or by dipping the sheet in a bath of the second immersion tin solution.

16. The process of claim 1, wherein the first immersion tin solution comprises:
   10 to 30 g/l total tin metal;
   20 to 80 g/l thiourea; and
   20 to 80 g/l methane sulfonic acid.

17. The process of claim 1, wherein the second immersion tin solution comprises:
   6 to 15 g/l stannous tin ion;
   10 to 25 g/l total tin metal;
   40 to 80 g/l thiourea;
   0 to 3.0 g/l copper; and
   8 to 12% by weight sulfuric acid.

18. The process of claim 1, wherein the first immersion tin solution is maintained at a temperature between 120 and 175° F.

19. The process of claim 1, wherein the second immersion tin solution is maintained at a temperature between 80 and 120° F.

20. The process of claim 1, wherein the sheet is immersed in the second immersion tin solution for a time sufficient to provide a thin tin deposit operative in conjunction with the first tin deposit to enhance subsequent bonding of the sheet to an organic polymer layer.

21. The process of claim 1, wherein the acidic medium of the second immersion tin solution comprises sulfuric acid.

* * * * *

UNITED STATES PATENT AND TRADEMARK OFFICE
CERTIFICATE OF CORRECTION

PATENT NO. : 6,645,549 B1
DATED : November 11, 2003
INVENTOR(S) : Darryl J. McKenney et al.

It is certified that error appears in the above-identified patent and that said Letters Patent is hereby corrected as shown below:

Title page,
Item [57], ABSTRACT,
Line 3, "immerses" should read -- immersed --;
Lines 13-17, delete the following:
"The board is then treated with a coupling agent, such as silane, for enhanced bonding to a subsequent epoxy or other polymer prepreg. Additionally, the first heavy tin deposit may serve as an etch resist in subsequent fabrication of the provided circuit board.";

Column 2,
Line 39, "in the second" should read -- In the second --; and

Column 4,
Line 12, "wherein further" should read -- further --.

Signed and Sealed this

Eighteenth Day of January, 2005

JON W. DUDAS
*Director of the United States Patent and Trademark Office*